United States Patent [19]
Sirinyan et al.

[11] Patent Number: 4,830,714
[45] Date of Patent: May 16, 1989

[54] PROCESS FOR THE PRODUCTION OF PRINTED CIRCUIT BOARDS

[75] Inventors: Kirkor Sirinyan, Bergisch Gladbach; Gerhard D. Wolf, Dormagen; Ulrich von Gizycki; Rudolf Merten, both of Leverkusen, all of Fed. Rep. of Germany

[73] Assignee: Bayer Aktiengesellschaft, Leverkusen, Fed. Rep. of Germany

[21] Appl. No.: 41,037

[22] Filed: Apr. 22, 1987

Related U.S. Application Data

[63] Continuation of Ser. No. 704,833, Feb. 25, 1985, abandoned.

[30] Foreign Application Priority Data

Feb. 28, 1984 [DE] Fed. Rep. of Germany ....... 3407114

[51] Int. Cl.$^4$ ................................................. C25D 7/00
[52] U.S. Cl. ......................................... 204/24; 427/97; 427/443.1; 427/98; 427/302; 427/306; 427/307
[58] Field of Search ..................... 427/443.1, 302, 306, 427/307, 322, 98, 97; 204/24

[56] References Cited

U.S. PATENT DOCUMENTS

| 3,501,332 | 3/1970 | Buckman | 427/306 |
| 4,042,387 | 8/1977 | Tarakci | 427/98 |
| 4,097,286 | 6/1978 | Dafter, Jr. | 106/1.11 |
| 4,281,034 | 7/1981 | Narayan | 427/306 |
| 4,285,991 | 8/1981 | Gedrat | 427/97 |
| 4,493,861 | 1/1985 | Sirinyan | 427/306 |

FOREIGN PATENT DOCUMENTS

| 86628 | 3/1984 | Japan | 427/307 |
| 1154152 | 6/1969 | United Kingdom . | |
| 2066582 | 7/1981 | United Kingdom . | |

Primary Examiner—Shrive Beck
Assistant Examiner—Vi Duong Dang
Attorney, Agent, or Firm—Sprung Horn Kramer & Woods

[57] ABSTRACT

An elegant method for the production of printed circuit boards possessing good electrical and mechanical properties comprises activating baseplates with a solution of complex compounds of elements of sub-group I or VIII of the periodic table, then applying a resist layer, exposing this partially according to a resist pattern, dissolving away the covered parts of the resist layer with a solvent, and metallizing the bared parts in a wet-chemical metallization bath in the absence of a current.

9 Claims, No Drawings

PROCESS FOR THE PRODUCTION OF PRINTED CIRCUIT BOARDS

This is a continuation of application Ser. No. 704,833 filed Feb. 25, 1985, now abandoned.

The invention relates to a wet-chemical process for the production of printed circuit boards by the additive or semi-additive method.

It is well known that the deposition of firmly adhering metal layers onto the conventional insulating base materials necessitates a complicated pretreatment. Thus, for example, the baseplates have first to be provided with an adhesion-promoting layer and then to be treated with an oxidizing liquid, preferably chromosulphuric acid, before the boards prepared in this manner are activated with ionic or colloidal noble metal solutions, masked, and metallised in commercial metallising baths.

Apart from the fact that this method entails a large number of steps, this technique has the disadvantage that entrained chromium ions poison the part irreversibly, and the printed circuit boards obtained possess unsatisfactory electrical properties.

It has therefore been proposed that the nonconducting surfaces of substrates, including, for example, baseplates of printed circuit boards, be activated with a solution or a surface coating containing a noble metal complex, this being done without oxidative pretreatment prior to the chemical metallisation (see, for example, DE-A Nos. 1 696 603 and 2 116 389).

However, these activation processes in which the materials are subjected to mild conditions have not become established in practice because they require relatively large amounts of activator and do not give metal layers possessing the high peel strength required in the electronics industry.

It has now been found that these disadvantages can be overcome, and high quality printed circuit boards can be obtained, if the procedure below is followed:

(a) the baseplates are treated with an activator system containing complex compounds of elements of sub-group IB or VIII of the periodic table, which contain at least one adhesion-promoting functional group, (b) after the solvent has been vaporized, a resist layer is applied, and is partially exposed according to a resist pattern, (c) the covered, and therefore non-crosslinked, parts of the resist layer are then dissolved away with a suitable solvent which may simultaneously be a swelling agent for the surface of the baseplates, and (d) the parts bared in this manner—if appropriate after transfer to a sensitisation bath—are metallised in a conventional wet-chemical metallisation bath in the absence of a current, and, if required, the thickness of the metallised parts is increased by electroplating.

It is to be regarded as extremely surprising that firmly adhering metal layers with crisp contours are obtained in this manner, since it was to be expected that at least some of the activator would also be removed when the non-cured resist layer was being dissolved away and the base surface was being swelled.

Suitable complex compounds in the activator solutions are $\pi$-complexes of olefines, conjugated dienes and $\alpha,\beta$-unsaturated ketones, as well as chelate complexes of compounds which contain nitrile, amine, carboxyl, hydroxyl, sulpho and sulphonamido groups and, in addition to these groups required for metal complex formation, contain at least one further functional group which improves the adhesion of the activator to the substrate surface.

This can be achieved by means of a chemical reaction with the substrate surface, but is preferably achieved by formation of hydrogen bridges or by the action of van der Waal's forces.

Particularly suitable for achieving such chemical anchoring of the activator to the substrate surface are functional groups such as carboxylic acid groups, carboxylic acid halide groups, carboxylic anhydride groups, carboxylic acid ester groups, carboxamido groups and carboximido groups, aldehyde and ketone groups, ether groups, sulphonamido groups, sulpho groups and sulphonate groups, sulphonyl halide groups, sulphonic acid ester groups, halogen-containing heterocyclic radicals, such as chlorotriazinyl, -pyrazinyl, -pyrimidyl or -quinoxalinyl groups, activated double bonds, as in vinylsulphonic acid derivatives or in acrylic acid derivatives, amino groups, hydroxyl groups, isocyanato groups, olefine groups and acetylene groups, mercapto groups and epoxide groups, and relatively long-chain alkyl or alkenyl radicals containing 8 or more C atoms, in particular oleyl, linoleyl, stearyl or palmityl groups.

Very particularly suitable groups are functional groups such as carboxylic acid groups, carboxylic anhydride groups, amido groups, carboxylic acid imide groups, keto groups, aldehyde groups and ester groups.

It is advantageous to match the adsorption-producing functional groups to the particular substrate. Thus, for example, long-chain alkyl or alkenyl groups in the activator molecule improve the adhesion to substrates consisting of polyethylene or polypropylene. On the other hand, activators containing, for example, additional carbonyl or sulphonyl groups are particularly advantageous for the metallisation of articles based on polyamides or polyesters.

Preferred activators are organometallic $\pi$ compounds of the elements Pd, Au, Pt or Ag, as described in, for example, DE-A No. 3,148,280. Particularly preferred compounds, some of which likewise are known or are obtainable by processes which are in themselves known, are the complex compounds of the elements of sub-group I or VIII of the periodic table in the oxidation states 1–4 (in particular monovalent palladium) with unsaturated ketones of the formula

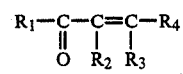

wherein
R$_1$ and R$_4$ denote C$_1$–C$_{20}$-alkyl, preferably C$_1$–C$_6$-alkyl, and
R$_2$ and R$_3$ denote hydrogen or C$_1$–C$_4$-alkyl, preferably methyl.

The following may be mentioned as examples: mesityl oxide, n-but-3-en-2-one, n-hept-3-en-2-one, n-hex-3-en-2-one, n-dec-4-en-3-one, 5-chloro-pent-3-en-2-one, ethyl vinyl ketone, 3-methyl-oct-5-en-4-one, 3-methyl-pent-3-en-2-one and 7-methoxy-hept-3-en-2-one.

Further examples of preferred complex formers are butadiene, 4-cyclohexene-1,2-dicarboxylic anhydride and 4-cyclohexene-1,2-dicarboximide. Palladium complexes of these are particularly preferred.

The new process according to the invention is advantageously carried out so that base materials are wet with the abovementioned organometallic compound. This can be carried out mainly by spraying with a readily volatile organic solution of the stated activators, or by immersion in these media. In this procedure, the concentration of the activator should be between 0.01 g and 10 g per liter of solvent. Preferred solvents are chlorinated hydrocarbons, such as $HCCl_3$, $CCl_4$, $CH_2Cl_2$ or $ClCH=CCl_2$, alcohols, such as $C_2H_5OH$ or $CH_3OH$, and mixtures of these with one another.

Base materials treated in this manner are, if appropriate, subsequently partially covered with a screen-like mask and, if required, are partially swelled in a solvent, and are sensitised, and then partially metallised in a reductive metallisation bath.

In most cases, "resist films" (photosensitive resists, photoresists), namely "negative resists" or "positive resists", can be used for partially covering the base materials, these resists being well known (see, for example, Gunther Hermann, "Leiterplatten, Herstellung und Vorbehandlung" (Printed circuit boards, manufacture and pretreatment), pages 98–103 and 125–127).

In the first case, the unexposed parts are removed with a suitable solvent after exposure, whereas in the second case the exposed parts are removed. A number of special resist systems can be used for the production of reliefs for the electronics sector or for the micro-electronics sector. The resist systems which can be cured with the aid of UV radiation, electron beam and laser beam may be mentioned in this connection (see DE-A No. 2 007 267, DE-A No. 2 454 879 and DE-A No. 2 507 874).

The relief mask can be applied by screen printing, coating or stamping.

Suitable substrates for the process according to the invention are boards, preferably boards which are provided with standard holes and consist of glass fibre-reinforced or glass mat-reinforced epoxy resins (see, for example, Kunststoffhandbuch, Prof. R. Vieweg, XI, pages 180–246, Carl Hanser Verlag, Munich (1971)), fluorine-containing polymers (see, for example, the above-mentioned literature reference, pages 673–674), such as PTFE (polytetrafluoroethylene), heat-curable plastics, such as phenol-formalin and/or melamine resins (see, for example, Prof. R. Vieweg "Kunststoff-Handbuch", X, pages 19–59 and 63–128), polypropylene, polyethylene, ABS (acrylonitrile/butadiene/styrene) copolymers or graft copolymers and polycondensates (for example polycarbonates, aromatic and/or aliphatic polyamides, polyesters, aromatic and/or aliphatic polyamides and polyamide-imides and their mixed condensates or cocondensates).

Solvents which are suitable for dissolving away the uncrosslinked parts of the resist layer are customary organic solvents in which the prepolymer of the resist layer is readily soluble. Advantageously, the solvent systems chosen are those which are at the same time a swelling agent for the substrates.

For example, solutions of a mixture of halides of elements of main groups 1 and/or 2 of the periodic table with salts of weak inorganic bases and strong inorganic acids are employed for the treatment of substrates based on polyamide condensates.

Suitable halides of elements of main groups 1 and 2 are, in particular, the chlorides, preferably $LiCl$, $BeCl_2$, $MgCl_2$ and $CaCl_2$.

Suitable salts of weak bases and strong acids are sulphates, nitrates, and especially chlorides of metals of main groups and sub-groups 3 and 4 and of nonnoble metals of sub-groups 6–8. $FeCl_2$, $FeCl_3$, $TiCl_3$, $TiCl_4$, $BCl_3$ and, in particular, $AlCl_3$ are preferred.

Suitable swelling agents and solvents are those as described in customary handbooks on polyamides (see, for example, "Die Polyamide" (The Polyamides) by Hopff. Muller, Wegner, Springer-Verlag (1954), and "Polymer Handbook" by Brandrup et al., New York, volume IV (1975) and "Kunststoffhandbuch" (Plastics Handbook) by Vieweg Muller; volume IV (1966)). The following may be mentioned as examples: Lower aliphatic and araliphatic alcohols, such as, for example, methanol, ethanol, isopropanol, n-propanol, n-butanol, benzyl alcohol and phenylethyl alcohol. Methanol is particularly preferred. Dimethyl sulphoxide and solvents containing amide groups, such as formamide and dimethylformamide, are also suitable. Mixtures of these solvents can of course also be employed.

If desired, customary polyamide plasticisers (0.2–10% by weight, or 0.5–5% by weight, relative to the total amount of liquid) can also be added. Benzenesulphonic acid monoethylamide, p-toluenesulphonic acid amide, dioxydiphenyl sulphone and dibenzyl alcohol may be mentioned as examples.

After the solvent treatment, the resulting "semi-finished products", which likewise form a subject of the invention, are freed from adhering solvent.

This is carried out in general by evaporation, if appropriate under reduced pressure. Relatively high-boiling solvents are advantageously removed by extraction or flushing with low-boiling solvents.

If fluorine polymers are employed as substrates, the preferred procedure in this variant comprises treating these polymers by immersion in an organic, preferably anhydrous, solution, such as THF (tetrahydrofuran), benzene and toluene, which additionally contain an organic alkali metal compound possessing a lone electron pair capable of forming a carbanion or carbcation. In this connection, reference may be made to the following literature references: N. D. Scott et al.: Am. Soc. 58, 2443 (1936); N.D. Scott: U.S. Pat. No. 2,181,771; M. Szware: Nature 178, 1168 (1956); and M. Szwarc: Am. Soc. 78, 2656 (1956). Naphthalene-sodium, naphthalene-lithium, benzene-lithium, benzene-sodium, and biphenyl-, triphenyl and butyl-lithium and -sodium are particularly preferred. The concentration of the organic alkali metal compounds should be 0.01 to 250, preferably 2.5–100, particularly preferably 5–75, g per liter of solvent.

The semi-finished boards treated in this manner are dried and then washed with $H_2O$ or lower alcohols. They are then activated, coated with a commercial resist, and prepared for partial metallisation by a wet-chemical method.

The semi-finished products according to the invention, for example the particularly preferred fluorine polymers, surprisingly possess excellent adhesion to the stated organometallic activators, commercial resists or screen printing layers, and can also be provided with a metal layer which exhibits very good adhesion in parts.

The thermosetting plastics which are also preferably employed for the production of base materials according to the invention and which are based on phenol resins, epoxy resins and melamine resins, can of course be provided with an adhesion-promoting surface coating (see, for example, G. Hermann, Leiterplatten, Herstellung und Vorbereitung (Printed circuit boards, manufacture and preparation), pages 164–168, Eugen G. Lenze Verlag, Saulgau/Wurtt. (1978)) which contains an elastomeric component. In order to increase the peel strength of the metal layer deposited in the final step, they can also be treated, after they have been activated, in solvents or swelling agents customarily used for ABS polymers (see, for example, "Polymer-Handbook", Brandrup et al., New York, volume IV (1975)) or in oxidising media.

The semi-finished base materials according to the invention, for the production of printed circuit boards, should possess the following properties:

1. In the activated state, they should be stable in the air to moisture.
2. Their activator layer should not be removable from the surface or capable of deactivation during application or development of photoresist layers.
3. Their activator layer should not be removed from the surface or deactivated during a swelling or oxidation process.
4. Furthermore, the relief layer must not be flushed from the surface of the material during the swelling or development process.
5. Ligands which poison the metallisation or sensitisation baths must not be liberated during sensitisation or metallisation.

The semi-finished products according to the invention must then be sensitised by reduction. This can preferably be done using the reducing agents usually employed in electroplating, such as hydrazine hydrate, formaldehyde, hypophosphite or boranes. It is of course also possible to use other reducing agents. The reduction is preferably carried out in aqueous solution. However, other solvents, such as alcohols, ethers or hydrocarbons, can also be employed. Suspensions or pastes of the reducing agents can of course also be used.

The surfaces sensitised in this manner can be employed directly for metallisation in the absence of a current. However, it may also be necessary to free the surface rom residual reducing agent by rinsing.

A very particularly preferred embodiment of the process according to the invention comprises carrying out the reduction in he metallisation bath, directly with the reducing agent used for the metallisation in the absence of a current. This embodiment constitutes a simplification of the metallisation in the absence of a current, this simplification being impossible hitherto.

This embodiment is very particularly suitable for aminoborane-containing nickel baths or formalin-containing copper baths.

Metallisation baths which are preferably employed in the process according to the invention are baths containing nickel salts, cobalt slats, copper salts, gold salts and silver salts or mixtures of these with one another or with iron salts. Metallisation baths of this type are known in the technology of metallisation in the absence of a current.

These metal layers deposited by a chemical method can of course be copper plated, silver plated, tin plated or galvanised in electrolytic metallisation baths.

EXAMPLE 1

A 200×200×1 mm glass fibre-reinforced polymer board consisting of nylon 6 is provided with 0.5 mm holes, activated in a bath comprising 1 liter of $CH_2Cl_2$ and 1.0 g of 4-cyclohexene-1,2-dicarboxylic acid anhydride-palladium(II) chloride in the course of 5 minutes at room temperature, and dried. After 7 days, the active semi-finished base material prepared in this manner is covered with a commercial screen printing mask which is based on a styrene/butadiene copolymer and has free comb-like paths about 500 $\mu$m wide, and is then after-treated for 5 minutes in a bath which consists of 1400 ml of methanol, 120 g of $CaCl_2$, 2.0 g of $AlCl_3$ and 400 ml of $H_2O$. The board is then sensitised in a bath consisting of 1200 ml of ethanol, 24 ml of $NH_3$ solution (25 % strength) and 500 ml of 2N DMAB (dimethylaminoborane) solution for 5 minutes, washed, and then copper-plated by a chemical method in a commercial copper-plating bath.

After about one minute, the free paths become dark in colour, and after 25 minutes an electrically conducting Cu layer is deposited, the thickness of this layer being increased to 40 $\mu$m with copper deposited by electroplating.

A plated through-hole printed circuit board possessing 500 $\mu$m wide and 40 $\mu$m thick circuit paths is obtained. The metal layer adheres to the substrate surface sufficiently well that it cannot be removed from the polymer surface in spite of after-treatment for one minute at 265° C. in a commercial soldering bath.

EXAMPLE 2

A 200×250×1 mm commercial rubber-grafted nylon 6 board is provided with 0.2 mm holes, activated in a bath consisting of 1 liter of $CH_2Cl_2$ and 0.9 g of mesityl oxide-palladium chloride in the course of 4 minutes at 18° C., dried, and sprayed with a UV-curable surface coating based on oligomeric 1,4-polyisoprene (5% strength by weight in xylene) with a photosensitive diazo initiator from AGFA-GEVAERT AG, and the surface coating layer is hardened physically. After one week, the active surface of the semi-finished product is covered with a photo mask and is partially crosslinked by means of UV radiation. After removal of the material from the sample, the non-crosslinked prepolymer area is removed in methanol (very pure). The base material is then after-treated in a bath consisting of 700 ml of methanol, 50 ml of n-butanol, 80 g of $CaCl_2$ and 2 g of $TiCl_4$ for 8 minutes at room temperature, sensitised according to Example 1, dried, and then nickel-plated in a commercial nickel-plating bath. After about 2 minutes, the free paths become silver grey in colour, and after about 20 minutes an Ni layer exhibiting good electrical conductivity is deposited, the thickness of this layer being increased to 40 $\mu$m with electrolytically deposited silver.

A plated through-hole printed circuit board possessing 30 $\mu$m wide, 40 $\mu$m thick circuit paths is obtained. The peel strength of the metal layer is approx. 60N/25 mm, measured according to DIN 53/494, and satisfies the two-minute soldering bath test at 255° C.

EXAMPLE 3

A 100×100×1 mm polymer board consisting of nylon 6 and reinforced with 40% of mineral fibres is activated in a bath consisting of 0.8 g of 4-cyclohexene-1,2-dicarboxylic acid imide-palladium(II) chloride and 1 liter of $CH_2Cl_2$ at 35° C. for 3 minutes, dried, and then coated with a UV-curable resist from M und T Chemicals GmbH, Stuttgart. After 14 days, the activated surface of the semi-finished product is covered with a photo mask, and partially crosslinked by means of UV radiation. After removal of the material from the base material, the non-crosslinked polymer area is removed in a commercial developer. The sample is then treated in a bath consisting of 1500 ml of EtOH, 120 g of CaCl$_2$, 20 ml of p-toluenesulphonamide and 3 g of AlCl$_3$ for 5 minutes at room temperature, sensitised according to Example 1, covered with a commercial screen printing mask which possesses free comb-like paths about 150 μm wide, washed, and then copper-plated by a chemical method in a commercial copper-plating bath.

After about a few minutes, the free paths become dark in colour, and after approx. 30 minutes an electrically conducting Cu layer is deposited.

The metal layer adheres to the polymer surface sufficiently well to satisfy the thermal shock test according to DIN 53,436.

EXAMPLE 4

A 200×200×1 mm commercial polytetrafluoroethylene film is pretreated for 5 minutes in a bath consisting of 1 mol of sodium, 1 mol of naphthalene and 1 liter of THF (very pure). Thereafter, the board is washed neutral with methanol and then treated in a bath which consists of 1.2 g of n-hept-3-en-2-one-palladium chloride and 1000 ml of CCl$_2$=CHCl, at 30° C. for 6 minutes, after which it is dried. The active board produced in this manner is provided with a mask, sensitised and then copper-plated, these steps being carried out according to Example 1. The metal layer adheres to the polymer surface sufficiently well that it cannot be removed from the polymer surface in spite of after-treatment for 5 minutes in a commercial soldering bath at 265° C.

EXAMPLE 5

A 200×200×1 mm polyvinyl fluoride film reinforced with approx. 30% by weight of mineral fibres is treated in a bath consisting of 90 g of benzene-lithium and 900 ml of THF (very pure) at room temperature for 5 minutes and activated according to Example 1 and, after a storage time of one month, is provided with a resist mask according to Example 2, sensitised according to Example 1, and then partially nickel-plated and the thickness of the paths increased to 40 μm with electrolytically deposited silver, these last two steps being carried out according to Example 2.

A plated through-hole printed circuit board possessing 30 μm wide, 40 μm thick circuit paths is obtained. The peel strength of the metal layer is approx. 50–60N/25 mm, measured according to DIN 53,494, and satisfies the five-minute soldering bath test at 250° C.

EXAMPLE 6

A 200×300 mm film consisting of an aromatic polyamide (condensation product of pyromellitic acid dianhydride (PMDA) and 4,4′-diaminodiphenyl ether) is provided with 0.25 mm holes, activated according to Example 3, or stored, and coated with a UV-sensitive surface coating from Merck AG, according to Example 3. The active semi-finished product prepared in this manner is partially crosslinked after 3 days, using UV radiation. The non-crosslinked prepolymer area is removed from the sample in a commercial developing bath. The sample is then sensitised and metallised according to Example 1.

A metallised printed circuit board is obtained. The metal layer adheres to the substrate surface sufficiently well that it cannot be removed from the polymer surface in spite of after-treatment for one minute at an elevated temperature (approx. 240° C.) in a commercial soldering bath.

EXAMPLE 7

A 100×200 mm rectangle of a commercial glass mat-reinforced and chemically roughened epoxy resin board provided with through-holes is activated according to Example 1. After a storage time of nine days, the plate is covered with a screen printing mask which possesses 80 μm wide comb-like paths, sensitised for 5 minutes at room temperature in a bath consisting of 1000 ml of methanol, 40 ml of hydrazine and 12 ml of NH$_3$ solution (25% strength), washed, and then nickel-plated according to Example 2, and the thickness of the paths are then increased to 40 μm with electrolytically deposited gold. A plated through-hole printed circuit board possessing a well-adhering metal layer is obtained.

EXAMPLE 8

A 100×200 mm rectangle of a commercial phenol resin/hard paper board which is provided with through-holes and the surface of which contains a 20 μm thick commercial adhesion-promoting layer to which 30% of rubber latex has been added is activated according to Example 3 and coated with a UV resist from Merck AG, Darmstadt. After 14 days, the active board is developed according to Example 3, sensitised according to Example 7, washed, and metallised according to Example 3.

After about a few minutes, the surface begins to darken, and after about 25 minutes, a metal layer exhibiting a metallic gloss and good adhesion has been deposited.

4-Cyclohexene-1,2-dicarboximide-palladium(II) chloride:

10 g of 4-cyclohexene-1,2-dicarboximide are dissolved in five times the amount of DMF (dimethylformamide), and an equimolar amount of acetonitrile-palladium dichloride is added in the course of 3 hours, at 45° C. DMF and acetonitrile are distilled off at 45° C./25 mbar. A brownish yellow solid of melting point ≈102° C. is obtained in 95% yield.

We claim:

1. In a process for the production of printed circuit boards by the additive or semi-additive method, by partial wet chemical metallization of baseplates in the absence of a current, with the aid of organometallic activators comprising complex compounds of elements of sub-group IB or VIII of the periodic table, which contain at least one adhesion-promoting functional group, wherein
   (a) standard holes are introduced in the baseplates selected from the group consisting of epoxy resins, fluorine-containing polymers, phenol-formalin resins, melamine resins, polypropylene, polyethylene, ABS co-polymers or graft copolymers, polycarbonates, polyamides, polyesters and polyamide-esters.
   (b) the baseplates are treated with said activator system,
   (c) after the solvent has been vaporized, the baseplates are partially covered with a screen-like mask, the improvement
   (d) the baseplates are treated with a suitable solvent which is a swelling agent for the surface of the baseplates, and (e) the parts bared in this manner are metallized in a conventional wet-chemical metallization bath in the absence of a current.

2. Process according to claim 1, characterised in that the complex compounds used are π-complexes of olefines, conjugated dienes and α,β-unsaturated ketones, and chelate complexes of compounds which contain nitrile, amino, carboxyl, hydroxyl, sulpho and sulphonamide groups and, in addition to the groups which are required for metal complex formation, contain at least one further functional group which improves the adhesion of the activator to the substrate surface.

3. Process according to claim 1, characterised in that the complex compounds used are those which contain, as functional groups, carboxylic acid groups, carboxylic anhydride groups, amide groups, carboxylic acid imide groups, keto groups, aldehyde groups and ester groups.

4. Process according to claim 1, characterised in that the complex compounds used are mesityl oxide-palladium chloride, hept-3-en-2-one-palladium chloride, butadiene-palladium chloride, 4-cyclohexene-1,2-dicarboxylic acid anhydride-palladium(II) chloride and 4-cyclohexene-1,2-dicarboxylic acid imide-palladium(II) chloride.

5. Process according to claim 1, characterised in that the complex compound used is 4-cyclohexene-1,2-dicarboxylic acid imide-palladium chloride.

6. Process according to claim 1, characterised in that the baseplates used are those which consist of optionally glass fibre-reinforced and/or mineral fibre-reinforced and/or rubber-grated nylon 6, nylon 6.6, nylon 11 or nylon 12 or their cocondensates or mixed condensates, or polytetrafluoroethylene, polyvinyl fluoride or polyvinylidene fluoride or their mixtures with one another or reinforced epoxy resins, phenol/formalin resins or melamine resins or their mixtures.

7. Process of claim 1 wherein the solvent treated surface is further treated in a sensation bath prior to metallization.

8. Process of claim 1 wherein the metallized surfaced is subject to an electroplating step to further increase the thickness of the metallized parts.

9. In a process for the production of a semi-finished product for further processing to printed circuit boards, wherein
(a) the baseplates selected from the group consisting of epoxy resins, fluorine-containing polymers, heat-curable plastics, polypropylene, polyethylene, ABS-copolymers or graft copolymers and polycondensates are treated with an activator solution based on complex compounds of the elements of sub-group IB or VIII of the periodic table, which contain at least one adhesion-promoting functional group.
(b) after the solvent has been evaporated, a resist layer is applied, and is partially exposed according to a resist method, or a screen printing mask is applied and exposed the improvement wherein
(c) the covered, and therefor non-crosslinked parts of the resist layer or mask are then dissolved away with a suitable solvent which is a swelling agent for the surface of the baseplate.

* * * * *